United States Patent
Li

(10) Patent No.: US 11,385,833 B2
(45) Date of Patent: Jul. 12, 2022

(54) METHOD AND SYSTEM FOR FACILITATING A LIGHT-WEIGHT GARBAGE COLLECTION WITH A REDUCED UTILIZATION OF RESOURCES

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 165 days.

(21) Appl. No.: 16/853,561

(22) Filed: Apr. 20, 2020

(65) Prior Publication Data

US 2021/0326068 A1    Oct. 21, 2021

(51) Int. Cl.
*H03M 13/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0604; G06F 3/0679; H03M 13/03; H03M 13/1108; H03M 13/1128; H03M 13/151; H03M 13/1575; H03M 13/159
See application file for complete search history.

(56) References Cited

U.S. PATENT DOCUMENTS 3,893,071 A   7/1975  Bossen
4,718,067 A   1/1988  Peters
(Continued)

FOREIGN PATENT DOCUMENTS

JP   2003022209   1/2003
JP   2011175422   9/2011
(Continued)

OTHER PUBLICATIONS

C. Wu, D. Wu, H. Chou and C. Cheng, "Rethink the Design of Flash Translation Layers in a Component-Based View", in IEEE Acess, vol. 5, pp. 12895-12912, 2017.
(Continued)

*Primary Examiner* — Esaw T Abraham
(74) *Attorney, Agent, or Firm* — Shun Yao; Yao Legal Services, Inc.

(57) ABSTRACT

A system is provided to receive, by a controller, a first request to read a first page of data stored in a storage device which comprises a plurality of non-volatile memory units. The system accumulates, by a calculation module, a syndrome associated with the first page of data to obtain a syndrome weight. In response to determining that the syndrome weight is less than a predetermined threshold, the system writes, by the controller, the first page of data to a destination page of the storage device. In response to determining that the syndrome weight is greater than the predetermined threshold and that a current number of retries is less than a predetermined number: the system executes a retry process between the calculation module and a data flip engine of the controller to update the syndrome weight; and the system increments the current number of retries.

20 Claims, 10 Drawing Sheets

(51) Int. Cl.
*G06F 12/10* (2016.01)
*H03M 13/03* (2006.01)
*H03M 13/11* (2006.01)
*H03M 13/15* (2006.01)
*H03M 13/29* (2006.01)

(52) U.S. Cl.
CPC ............ *G06F 12/10* (2013.01); *H03M 13/03* (2013.01); *H03M 13/1108* (2013.01); *H03M 13/1128* (2013.01); *H03M 13/151* (2013.01); *H03M 13/159* (2013.01); *H03M 13/1575* (2013.01); *H03M 13/2948* (2013.01); *G06F 2212/657* (2013.01)

(56) References Cited

U.S. PATENT DOCUMENTS

| | | | |
|---|---|---|---|
| 4,775,932 A | 10/1988 | Oxley | |
| 5,394,382 A | 2/1995 | Hu | |
| 5,715,471 A | 2/1998 | Otsuka | |
| 5,732,093 A | 3/1998 | Huang | |
| 5,802,551 A | 9/1998 | Komatsu | |
| 5,930,167 A | 7/1999 | Lee | |
| 6,098,185 A | 8/2000 | Wilson | |
| 6,148,377 A | 11/2000 | Carter | |
| 6,226,650 B1 | 5/2001 | Mahajan et al. | |
| 6,243,795 B1 | 6/2001 | Yang | |
| 6,457,104 B1 | 9/2002 | Tremaine | |
| 6,658,478 B1 | 12/2003 | Singhal | |
| 7,351,072 B2 | 4/2008 | Muff | |
| 7,565,454 B2 | 7/2009 | Zuberi | |
| 7,599,139 B1 | 10/2009 | Bombet | |
| 7,953,899 B1 | 5/2011 | Hooper | |
| 7,958,433 B1 | 6/2011 | Yoon | |
| 8,085,569 B2 | 12/2011 | Kim | |
| 8,144,512 B2 | 3/2012 | Huang | |
| 8,166,233 B2 | 4/2012 | Schibilla | |
| 8,260,924 B2 | 9/2012 | Koretz | |
| 8,281,061 B2 | 10/2012 | Radke | |
| 8,452,819 B1 | 5/2013 | Sorenson, III | |
| 8,516,284 B2 | 8/2013 | Chan | |
| 8,527,544 B1 | 9/2013 | Colgrove | |
| 8,751,763 B1 | 6/2014 | Ramarao | |
| 8,769,380 B1 * | 7/2014 | Burd ................. | H03M 13/3715 714/774 |
| 8,819,367 B1 | 8/2014 | Fallone | |
| 8,825,937 B2 | 9/2014 | Atkisson | |
| 8,832,688 B2 | 9/2014 | Tang | |
| 8,868,825 B1 | 10/2014 | Hayes | |
| 8,904,061 B1 | 12/2014 | O'Brien, III | |
| 8,949,208 B1 | 2/2015 | Xu | |
| 9,015,561 B1 | 4/2015 | Hu | |
| 9,031,296 B2 | 5/2015 | Kaempfer | |
| 9,043,545 B2 | 5/2015 | Kimmel | |
| 9,088,300 B1 | 7/2015 | Chen | |
| 9,092,223 B1 | 7/2015 | Pani | |
| 9,128,868 B2 * | 9/2015 | Lastras-Montano .... | G06F 11/08 |
| 9,129,628 B1 | 9/2015 | Fallone | |
| 9,213,627 B2 | 12/2015 | Van Acht | |
| 9,280,472 B1 | 3/2016 | Dang | |
| 9,280,487 B2 | 3/2016 | Candelaria | |
| 9,336,340 B1 | 5/2016 | Dong | |
| 9,436,595 B1 | 9/2016 | Benitez | |
| 9,495,263 B2 | 11/2016 | Pang | |
| 9,529,601 B1 | 12/2016 | Dharmadhikari | |
| 9,529,670 B2 | 12/2016 | O'Connor | |
| 9,543,983 B2 * | 1/2017 | Tseng ................. | H03M 13/3746 |
| 9,569,454 B2 | 2/2017 | Ebsen | |
| 9,575,982 B1 | 2/2017 | Sankara Subramanian | |
| 9,588,698 B1 | 3/2017 | Karamcheti | |
| 9,588,977 B1 | 3/2017 | Wang | |
| 9,607,631 B2 | 3/2017 | Rausch | |
| 9,671,971 B2 | 6/2017 | Trika | |
| 9,747,202 B1 | 8/2017 | Shaharabany | |
| 9,836,232 B1 | 12/2017 | Vasquez | |
| 9,852,076 B1 | 12/2017 | Garg | |
| 9,875,053 B2 | 1/2018 | Frid | |
| 9,912,530 B2 | 3/2018 | Singatwaria | |
| 9,923,562 B1 | 3/2018 | Vinson | |
| 9,946,596 B2 | 4/2018 | Hashimoto | |
| 9,959,059 B2 * | 5/2018 | Orme ................. | G06F 12/0238 |
| 10,013,169 B2 | 7/2018 | Fisher | |
| 10,199,066 B1 | 2/2019 | Feldman | |
| 10,229,735 B1 | 3/2019 | Natarajan | |
| 10,235,198 B2 | 3/2019 | Qiu | |
| 10,268,390 B2 | 4/2019 | Warfield | |
| 10,318,467 B2 | 6/2019 | Barzik | |
| 10,361,722 B2 | 7/2019 | Lee | |
| 10,437,670 B1 | 10/2019 | Koltsidas | |
| 10,459,663 B2 | 10/2019 | Agombar | |
| 10,567,006 B2 * | 2/2020 | Hahn ................. | G06F 3/0619 |
| 10,599,515 B2 * | 3/2020 | Kalavade ............... | G11C 29/52 |
| 10,642,522 B2 | 5/2020 | Li | |
| 10,649,657 B2 | 5/2020 | Zaidman | |
| 10,678,432 B1 | 6/2020 | Dreier | |
| 10,679,722 B2 * | 6/2020 | Helmick ............. | G06F 11/1048 |
| 10,707,902 B2 * | 7/2020 | Hsiao ................... | G06F 3/0604 |
| 10,756,816 B1 | 8/2020 | Dreier | |
| 10,915,395 B2 * | 2/2021 | Luo ..................... | G06F 3/0659 |
| 10,928,847 B2 | 2/2021 | Suresh | |
| 10,990,526 B1 | 4/2021 | Lam | |
| 2001/0032324 A1 | 10/2001 | Slaughter | |
| 2001/0046295 A1 | 11/2001 | Sako | |
| 2002/0010783 A1 | 1/2002 | Primak | |
| 2002/0073358 A1 | 6/2002 | Atkinson | |
| 2002/0095403 A1 | 7/2002 | Chandrasekaran | |
| 2002/0112085 A1 | 8/2002 | Berg | |
| 2002/0161890 A1 | 10/2002 | Chen | |
| 2003/0074319 A1 | 4/2003 | Jaquette | |
| 2003/0145274 A1 | 7/2003 | Hwang | |
| 2003/0163594 A1 | 8/2003 | Aasheim | |
| 2003/0163633 A1 | 8/2003 | Aasheim | |
| 2003/0217080 A1 | 11/2003 | White | |
| 2004/0010545 A1 | 1/2004 | Pandya | |
| 2004/0066741 A1 | 4/2004 | Dinker | |
| 2004/0103238 A1 | 5/2004 | Avraham | |
| 2004/0143718 A1 | 7/2004 | Chen | |
| 2004/0255171 A1 | 12/2004 | Zimmer | |
| 2004/0267752 A1 | 12/2004 | Wong | |
| 2004/0268278 A1 | 12/2004 | Hoberman | |
| 2005/0038954 A1 | 2/2005 | Saliba | |
| 2005/0097126 A1 | 5/2005 | Cabrera | |
| 2005/0138325 A1 | 6/2005 | Hofstee | |
| 2005/0144358 A1 | 6/2005 | Conley | |
| 2005/0177672 A1 | 8/2005 | Rao | |
| 2005/0177755 A1 | 8/2005 | Fung | |
| 2005/0195635 A1 | 9/2005 | Conley | |
| 2005/0235067 A1 | 10/2005 | Creta | |
| 2005/0235171 A1 | 10/2005 | Igari | |
| 2006/0031709 A1 | 2/2006 | Hiraiwa | |
| 2006/0101197 A1 | 5/2006 | Georgis | |
| 2006/0156009 A1 | 7/2006 | Shin | |
| 2006/0156012 A1 | 7/2006 | Beeson | |
| 2006/0184813 A1 | 8/2006 | Bui | |
| 2007/0033323 A1 | 2/2007 | Gorobets | |
| 2007/0061502 A1 | 3/2007 | Lasser | |
| 2007/0101096 A1 | 5/2007 | Gorobets | |
| 2007/0250756 A1 | 10/2007 | Gower | |
| 2007/0266011 A1 | 11/2007 | Rohrs | |
| 2007/0283081 A1 | 12/2007 | Lasser | |
| 2007/0283104 A1 | 12/2007 | Wellwood | |
| 2007/0285980 A1 | 12/2007 | Shimizu | |
| 2008/0028223 A1 | 1/2008 | Rhoads | |
| 2008/0034154 A1 | 2/2008 | Lee | |
| 2008/0065805 A1 | 3/2008 | Wu | |
| 2008/0082731 A1 | 4/2008 | Karamcheti | |
| 2008/0112238 A1 | 5/2008 | Kim | |
| 2008/0163033 A1 | 7/2008 | Yim | |
| 2008/0195829 A1 | 8/2008 | Wilsey | |
| 2008/0301532 A1 | 12/2008 | Uchikawa | |
| 2009/0006667 A1 | 1/2009 | Lin | |
| 2009/0089544 A1 | 4/2009 | Liu | |
| 2009/0113219 A1 | 4/2009 | Aharonov | |
| 2009/0125788 A1 | 5/2009 | Wheeler | |

(56) References Cited

U.S. PATENT DOCUMENTS

| | | |
|---|---|---|
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0281254 A1 | 11/2010 | Carro |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | McWilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2011/0302408 A1 | 12/2011 | McDermott |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0138871 A1 | 5/2013 | Chiu |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0179898 A1 | 7/2013 | Fang |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2014/0379965 A1 | 12/2014 | Gole |
| 2015/0006792 A1 | 1/2015 | Lee |
| 2015/0019798 A1 | 1/2015 | Huang |
| 2015/0039849 A1 | 2/2015 | Lewis |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0186657 A1 | 7/2015 | Nakhjiri |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363248 A1* | 12/2015 | D'abreu ............ G06F 11/0751 714/37 |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0103732 A1* | 4/2016 | Tuers ................ G11C 29/52 714/764 |
| 2016/0110254 A1 | 4/2016 | Cronie |
| 2016/0124742 A1 | 5/2016 | Rangasamy |
| 2016/0132237 A1 | 5/2016 | Jeong |
| 2016/0141047 A1 | 5/2016 | Sehgal |
| 2016/0154601 A1 | 6/2016 | Chen |
| 2016/0155750 A1 | 6/2016 | Yasuda |
| 2016/0162187 A1 | 6/2016 | Lee |

(56) References Cited

U.S. PATENT DOCUMENTS

| | | |
|---|---|---|
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0116127 A1 | 4/2019 | Pismenny |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0089430 A1 | 3/2020 | Kanno |
| 2020/0097189 A1 | 3/2020 | Tao |
| 2020/0143885 A1 | 5/2020 | Kim |
| 2020/0159425 A1 | 5/2020 | Flynn |
| 2020/0167091 A1 | 5/2020 | Haridas |
| 2020/0210309 A1 | 7/2020 | Jung |
| 2020/0218449 A1 | 7/2020 | Leitao |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0326855 A1 | 10/2020 | Wu |
| 2020/0328192 A1 | 10/2020 | Zaman |
| 2020/0348888 A1 | 11/2020 | Kim |
| 2020/0387327 A1 | 12/2020 | Hsieh |
| 2020/0401334 A1 | 12/2020 | Saxena |
| 2020/0409791 A1 | 12/2020 | Devriendt |
| 2021/0010338 A1 | 1/2021 | Santos |
| 2021/0089392 A1 | 3/2021 | Shirakawa |
| 2021/0103388 A1 | 4/2021 | Choi |
| 2021/0191635 A1 | 6/2021 | Hu |
| 2021/0286555 A1 | 9/2021 | Li |

FOREIGN PATENT DOCUMENTS

| | | |
|---|---|---|
| WO | 9418634 | 8/1994 |
| WO | 1994018634 | 8/1994 |

OTHER PUBLICATIONS

Po-Liang Wu, Yuan-Hao Chang and T. Kuo, "A file-system-aware FTL design for flash-memory storage systems," 2009, pp. 393-398.

(56) References Cited

OTHER PUBLICATIONS

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.
A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.
J. Jung and Y. Won, "nvramdisk: A Transactional Block Device Driver for Non-Volatile RAM", in IEEE Transactions on Computers, vol. 65, No. 2, pp. 589-600, Feb. 1, 2016.
Te I et al. (Pensieve: a Machine Assisted SSD Layer for Extending the Lifetime: (Year: 2018).
ARM ("Cortex-R5 and Cortex-R5F", Technical reference Manual, Revision r1p1) (Year:2011).
https://web.archive.org/web/20071130235034/http://en.wikipedia.org:80/wiki/logical_block_addressing Wikipedia screen shot retriefed on wayback Nov. 20, 2007 showing both physical and logical addressing used historically to access data on storage devices (Year: 2007).
Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.
EMC Powerpath Load Balancing and Failover Comparison with native MPIO operating system solutions. Feb. 2011.
Tsuchiya, Yoshihiro et al. "DBLK: Deduplication for Primary Block Storage", MSST 2011, Denver, CO, May 23-27, 2011 pp. 1-5.
Chen Feng, et al. "CAFTL: A Content-Aware Flash Translation Layer Enhancing the Lifespan of Flash Memory based Solid State Devices"< FAST'11, San Jose, CA Feb. 15-17, 2011, pp. 1-14.
Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.
WOW: Wise Ordering for Writes—Combining Spatial and Temporal Locality in Non-Volatile Caches by Gill (Year: 2005).
Helen H. W. Chan et al. "HashKV: Enabling Efficient Updated in KV Storage via Hashing", https://www.usenix.org/conference/atc18/presentation/chan, (Year: 2018).
S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.
Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.
Jimenex, X., Novo, D. and P. Ienne, "Pheonix:Reviving MLC Blocks as SLC to Extend NAND Flash Devices Lifetime, "Design, Automation & Text in Europe Conference & Exhibition (DATE), 2013.
Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

\* cited by examiner

METHOD AND SYSTEM FOR FACILITATING A LIGHT-WEIGHT GARBAGE COLLECTION WITH A REDUCED UTILIZATION OF RESOURCES

BACKGROUND

Field

This disclosure is generally related to the field of data storage. More specifically, this disclosure is related to a method and system for facilitating a light-weight garbage collection with a reduced utilization of resources.

Related Art

Today, various storage systems are being used to store and access the ever-increasing amount of digital content. A storage system can include storage servers with one or more storage devices or drives, and a storage device or drive can include storage media with persistent memory, i.e., a non-volatile memory. A solid state drive (SSD) is a type of storage drive and can include Not-AND (NAND) flash memory as the non-volatile memory. One operation which is performed during the usage of an SSD is garbage collection, which can involve identifying a block to be recycled, copying out valid pages from the identified block, and erasing the identified block. Copying out the valid pages can result in moving data from a current NAND page to a destination NAND page by moving the data through host system memory. This data movement can create a challenge on the requirements of a high-performance design which also requires a large amount of memory bandwidth. Thus, the resource consumption associated with the garbage collection operation can decrease the efficiency and performance of an SSD and of an overall storage system.

SUMMARY

One embodiment provides a system which facilitates operation of a storage system. During operation, the system receives, by a controller, a first request to read a first page of data stored in a storage device which comprises a plurality of non-volatile memory units. The system accumulates, by a calculation module, a syndrome associated with the first page of data to obtain a syndrome weight. In response to determining that the syndrome weight is less than a predetermined threshold, the system writes, by the controller, the first page of data to a destination page of the storage device. In response to determining that the syndrome weight is greater than the predetermined threshold and that a current number of retries is less than a predetermined number: the system executes a retry process between the calculation module and a data flip engine of the controller to update the syndrome weight; and the system increments the current number of retries.

In some embodiments, in response to determining that the syndrome weight is greater than the predetermined threshold and that the current number of retries is greater than the predetermined number, the system: obtains, by the controller, the first page of data from the first non-volatile memory unit; decodes the obtained data based on an error correction code; stores the decoded data in a buffer of the controller; in response to acknowledging a completion of the first request, receives a second request to write the first page of data to the storage device; and writes, by the controller, the stored data from the buffer to the storage device.

In some embodiments, the obtained data is decoded by an error correction code module of the controller. The second request indicates the destination page of the non-volatile memory to which the first page of data is to be written. The stored data is written by the controller from the buffer to the destination page of the non-volatile memory.

In some embodiments, the first request and the second request are received from a flash translation layer (FTL) module of a host or the storage device, and the first request and the second request are associated with a garbage collection operation. Acknowledging the completion of the first request involves generating an acknowledgment for a host.

In some embodiments, the calculation module resides in a first non-volatile memory unit in which the first page of data is stored. In response to determining that the syndrome weight is less than the predetermined threshold, the system: in response to determining that the destination page is in the first non-volatile memory unit, the system writes the first page of data directly from the first page to the destination page; and in response to determining that the destination page is in a second non-volatile memory unit which is different from the first non-volatile memory unit, the system writes the data from the first non-volatile memory unit to a buffer of the controller, and writes the data from the buffer of the controller to the destination page of the second non-volatile memory unit.

In some embodiments, the system writes the first page of data to the destination page of the non-volatile memory by: writing the first page of data with a corresponding logical block address to the destination page of the non-volatile memory; and updating a mapping table which maps the logical block address to physical address associated with the destination page.

In some embodiments, the system executes the retry process between the calculation module and the data flip engine of the controller to update the syndrome weight by: inputting each respective column of a plurality of columns of a parity check matrix corresponding to the first page of data and each bit of a plurality of bits of the first page of data to a multiplexer; selecting, by the multiplexer, a respective column responsive to determining that a respective bit has a value of 1; selecting, by the multiplexer, a zero vector responsive to determining that the respective bit has a value of 0; and determining a pattern corresponding to the syndrome weight by accumulating data selected by the multiplexer, wherein determining the pattern is based on a series of parallel exclusive-OR and D-Flip-Flop pairs, and wherein the parallel D-Flip-Flop pairs are reset to zero at the beginning of each retry process.

In some embodiments, the calculation module sends, to the data flip engine, the determined pattern, and the data flip engine sends, to the calculation module, instructions indicating locations in the accumulated data at which to flip a respective bit.

BRIEF DESCRIPTION OF THE FIGURES

In the figures, like reference numerals refer to the same figure elements.

DETAILED DESCRIPTION

Figures 1A, 1B:
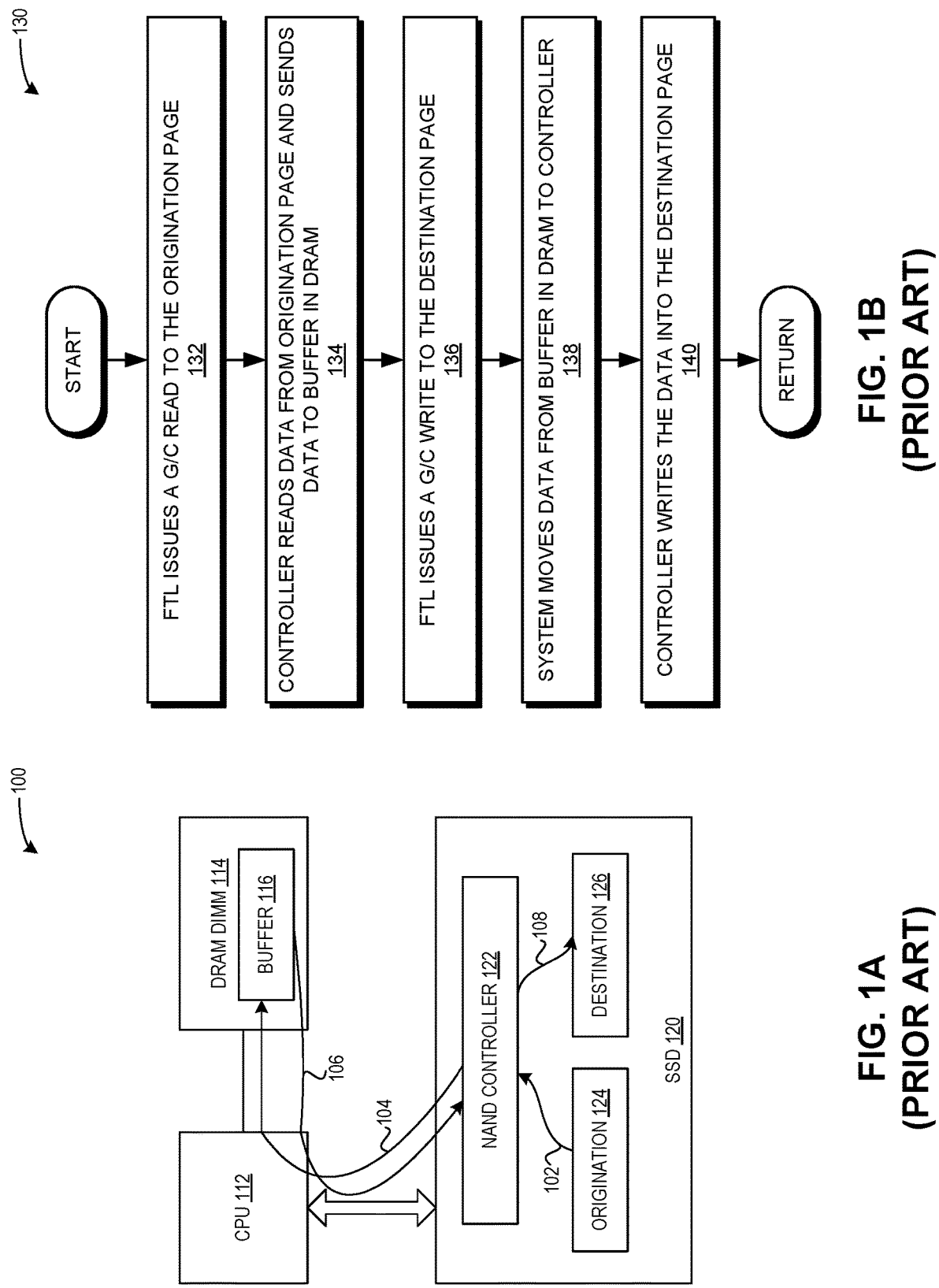
FIG. 1A illustrates an exemplary environment with data movement in a garbage collection operation, in accordance with the prior art.
FIG. 1B presents a flowchart corresponding to the exemplary data movement of FIG. 1A, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein facilitate a storage system which uses a "light-weight" garbage collection with a reduced utilization of resources. The light-weight garbage collection can result in reducing data movement within the storage system, in both a host-based flash translation layer (FTL) system and a device-based FTL SSD.

As described above, garbage collection is an operation performed during normal usage of an SSD. A garbage collection operation can involve identifying a block to be recycled, copying out valid pages from the identified block, and erasing the identified block. Copying out the valid pages can result in moving data from a current NAND page to a destination NAND page by moving the data through host system memory. For example, during a garbage collection operation, an FTL can issue a read request to a source NAND page. The system can read data from the source NAND page, and send the read data to host memory (e.g., a DRAM buffer). Subsequently, the FTL can issue a write request for the stored data in the DRAM buffer, to be written to a destination NAND page. The system can write the data from the DRAM buffer to the destination NAND page. This data movement can create a challenge on the requirements of a high-performance design which also requires a large amount of memory bandwidth, as described below in relation to FIGS. 1A and 1B. Thus, the resource consumption associated with the garbage collection operation can decrease the efficiency and performance of an SSD and of an overall storage system.

The embodiments described herein address these issues by providing a storage system which uses the error correction code (ECC) encoding/decoding ("codec") module of an SSD controller to perform ECC functions during a garbage collection operation. The system can read data from a source NAND page into a data buffer of the controller, and the ECC decoder of the controller can fix errors to obtain error-free (or close to error-free) data. The system can subsequently write the error-free data to a destination page based on a physical address assigned by either a host-based FTL or a device-based FTL, thus avoiding the data movement between the SSD and the host which results in a high resource consumption. An exemplary environment which facilitates a reduced utilization of resources is described below in relation to FIGS. 2A and 2B While the ECC module in the controller can reduce the utilization of resources in a storage system during a garbage collection process, the ECC module may also serve as a traffic bottleneck in some high-throughput scenarios. The described embodiments can reduce the involvement of the ECC module in the controller by implementing a syndrome calculation module in each NAND flash unit, where a respective syndrome calculation module can be shared and used by multiple physical NAND dies of a respective NAND flash unit. The syndrome calculation module can accumulate a syndrome associated with a given page of data to obtain a syndrome weight, and execute a retry process with a data flip engine of the controller based on whether a syndrome weight is less/greater than a predetermined threshold and on whether a current number of retries is less/greater than a predetermined number. An exemplary retry process between a syndrome calculation module and a data flip engine is described below in relation to FIG. 3, and an exemplary circuit of a syndrome calculation module is described below in relation to FIG. 4.

Thus, the embodiments described herein can result in a mitigation of the utilization of resources in a storage system, e.g., during a garbage collection process in a NAND flash-based non-volatile memory of a storage device. The described system can result in decreasing both the amount of data movement and the intensity of the data movement (e.g., based on an amount of resources utilized by a particular process). One such process is garbage collection. The described system can thus provide a light-weight garbage collection operation.

These improvements are based on providing an ECC codec module in the storage device controller and reducing the involvement of the controller. Because the system determines to tolerate the existence of certain errors (i.e., "error tolerance") in the page data prior to writing the data to a destination page, the syndrome calculation module and the data flip engine can collaborate to manage the error tolerance in a garbage collection operation. These improvements can result in a light-weight garbage collection, with a reduced data movement, and in turn can reduce the utilization of resources in the overall storage system. Furthermore, by significantly reducing the amount of data movement in the storage system, the described embodiments can provide an enhancement to noise immunity on the raw read channel.

A "distributed storage system" or a "storage system" can include multiple storage servers. A "storage server" or a "storage system" can refer to a computing device which can include multiple storage devices or storage drives. A "storage device" or a "storage drive" refers to a device or a drive with a non-volatile memory which can provide persistent storage of data, e.g., a solid state drive (SSD), a hard disk drive (HDD), an MRAM-based storage device, or a flash-based storage device. A storage system can also be a computer system.

A "computing device" refers to any server, device, node, entity, drive, or any other entity which can provide any computing capabilities.

A "controller" or "device controller" refers to a unit, module, or component of a persistent storage device, such as a NAND controller of an SSD.

An "error correction code (ECC) module" or an "ECC-encoding/decoding module" or an "ECC codec" refers to a unit, module, or component which can perform an encoding or a decoding based on an ECC.

A "light-weight garbage collection" operation or process refers to a garbage collection operation associated with or which involves a reduced amount and intensity of data movement, as described below in relation to FIGS. 2A and 2B, and as compared with the significant amount and intensity of data movement described below in relation to the prior art environment of FIGS. 1A and 1B.

Exemplary Operation of a Storage System in the Prior Art

FIG. 1A illustrates an exemplary environment 100 with data movement in a garbage collection operation, in accordance with the prior art. Environment 100 can correspond to a storage system, and can include: a central processing unit (CPU) 112; an associated dynamic random-access memory (DRAM) dual in-line memory module (DIMM) 114 with a data buffer 116; and a solid state drive (SSD) 120. SSD 120 can include a NAND controller 122, which can communicate with physical media of SSD 120 to retrieve and write data. Physical media can include data stored in various units or locations, such as pages or blocks, and can further include an origination page 124 and a destination page 126.

FIG. 1B presents a flowchart 130 corresponding to the exemplary data movement of FIG. 1A, in accordance with the prior art. During operation, a flash translation layer (FTL) can issue a garbage collection read to origination page 124 (operation 132). NAND controller 122 can read data from origination page 124 (via a communication 102) and send the read data to buffer 116 of DRAM 114 to be stored in buffer 116 (via a communication 104) (operation 134). The FTL can issue a garbage collection write to destination page 126 (operation 136). The system can move the stored data from buffer 116 in DRAM 114 to NAND controller 122 of SSD 120 (via a communication 106) (operation 138). Controller 122 can subsequently write the data to destination page 126 (via a communication 108) (operation 140).

This conventional storage system re-uses the host read and write operations to accomplish garbage collection operations, and may thus be limited by the following factors. First, a tremendous amount of data can pass through the host interface between the host system memory and the non-volatile memory, on a regular and consistent basis. This data movement can consume the bandwidth of both memory and the Peripheral Component Interconnect Express (PCIe) bandwidth, which may leave the overall system without sufficient bandwidth to provide high-performance (or even sufficient performance) for certain scenarios.

Second, the data movement described in relation to FIGS. 1A and 1B can include data processing, including but not limited to: error correction code (ECC) encoding and decoding, and operations relating to performing a parity check. Furthermore, the operations related to copying data between host system memory and the non-volatile memory can consume the resources of both the CPU and the device controller, and can also lead to a high consumption of power.

Third, the significant amount of data movement can become a performance bottleneck in a high-throughput, high-capacity drive. In particular, certain shared modules may incur a high cost, such as the ECC codec module.

Thus, conventional storage system 100 (as described in relation to both FIGS. 1A and 1B) may be limited in handling the significant amount of data movement involved in a high-performance, high-capacity storage device.

Figure 2B:
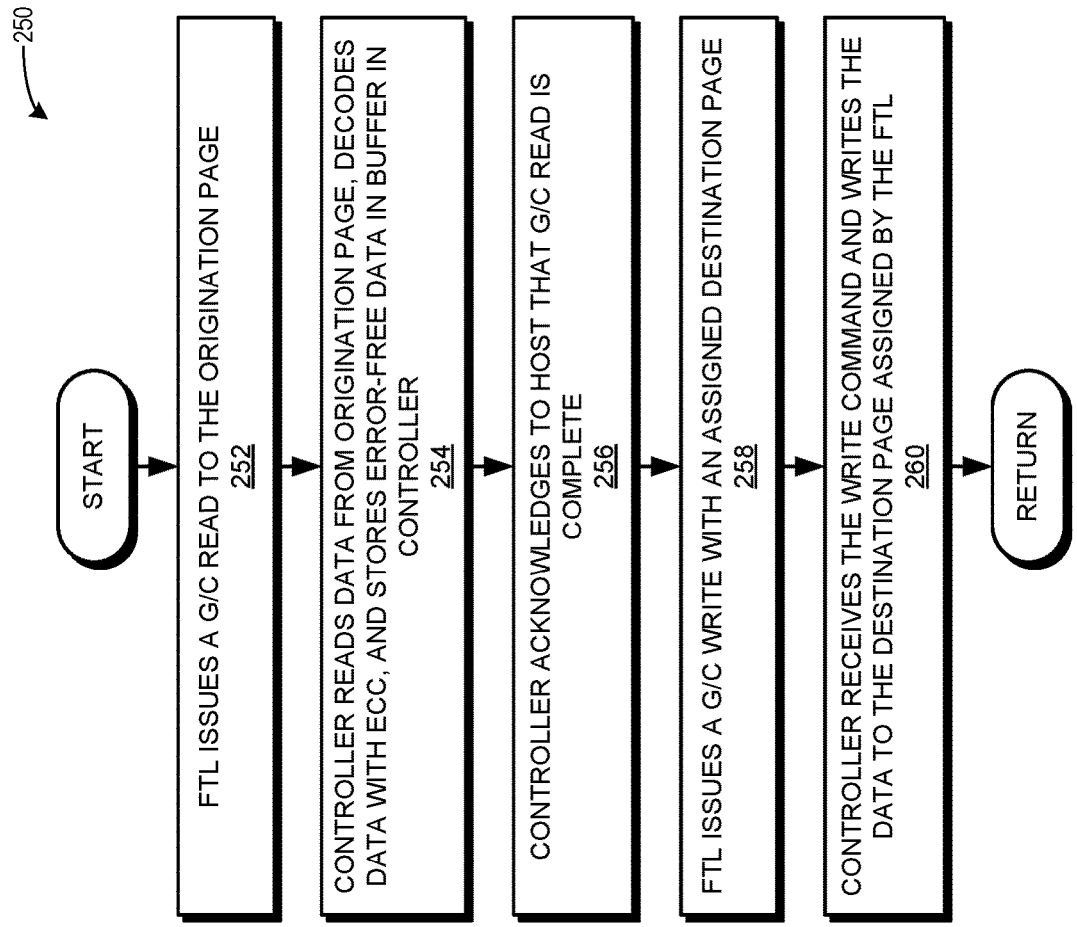
FIG. 2B presents a flowchart corresponding to the exemplary data movement of FIG. 2A, in accordance with an embodiment of the present application.
Figure 2A:
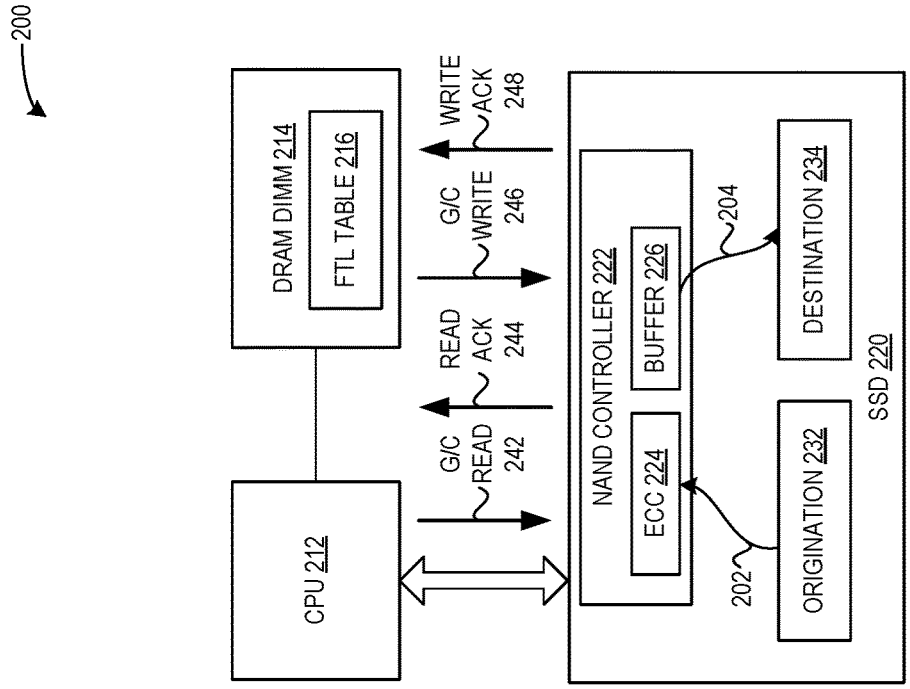
FIG. 2A illustrates an exemplary environment with data movement in a garbage collection operation, in accordance with an embodiment of the present application.

Exemplary Operation of a Storage System which Facilitates a Light-Weight Garbage Collection and a Reduced Utilization of Resources FIG. 2A illustrates an exemplary environment 200 with data movement in a garbage collection operation, in accordance with an embodiment of the present application. Environment 200 can correspond to a storage system, and can include: a central processing unit (CPU) 212; an associated DRAM DIMM 214 with a flash translation layer (FTL) table 116; and a solid state drive (SSD) 220. SSD 220 can include a NAND controller 222, which can communicate with physical media of SSD 220 to retrieve and write data. Physical media can include data stored in various units and locations, such as pages or blocks, and can further include an origination page 224 and a destination page 226.

FIG. 2B presents a flowchart 250 corresponding to the exemplary data movement of FIG. 2A, in accordance with the prior art. During operation, a flash translation layer (FTL) can issue a garbage collection read to origination page 232 ("g/c read 242") (operation 252). NAND controller 222 can read data from origination page 232 (via a communication 202), decode the data with ECC (by ECC codec module 224 of NAND controller 222), and store the error-free data in buffer 226 of NAND controller 222 (operation 254). NAND controller 222 can acknowledge to the host that the garbage collection read is complete ("read ACK 244") (operation 256). The FTL can issue a garbage collection write to destination page 234 ("g/c write 246") (operation 258). NAND controller 222 of SSD 220 can receive the write command and write (via a communication 204) the stored error-free data in buffer 226 to destination page 234, which is assigned by the FTL (operation 260). NAND controller 222 can acknowledge to the host that the write command is complete ("write ACK 248").

Thus, in the embodiments of the present application, as described above in relation to FIGS. 2A and 2B, the system may use only the ECC codec of the controller during a garbage collection operation. For example, the system reads the raw data from the origination page into the controller data buffer, which allows the ECC decode to fix any errors in the read raw data. The destination page address can be assigned by the FTL, which can be either executed by a host driver (as in a host-based FTL) or by embedded firmware (as in a device-based FTL). The controller can write the error-free data to the destination page. As the ECC decoder generally generates an error-free codeword, the system does not need to perform an ECC-encoding on the user data again. Note that while FIGS. 2A and 2B depict a scenario with a host-based FTL, similar functions are applicable in a scenario with a device-based FTL.

Figure 3:
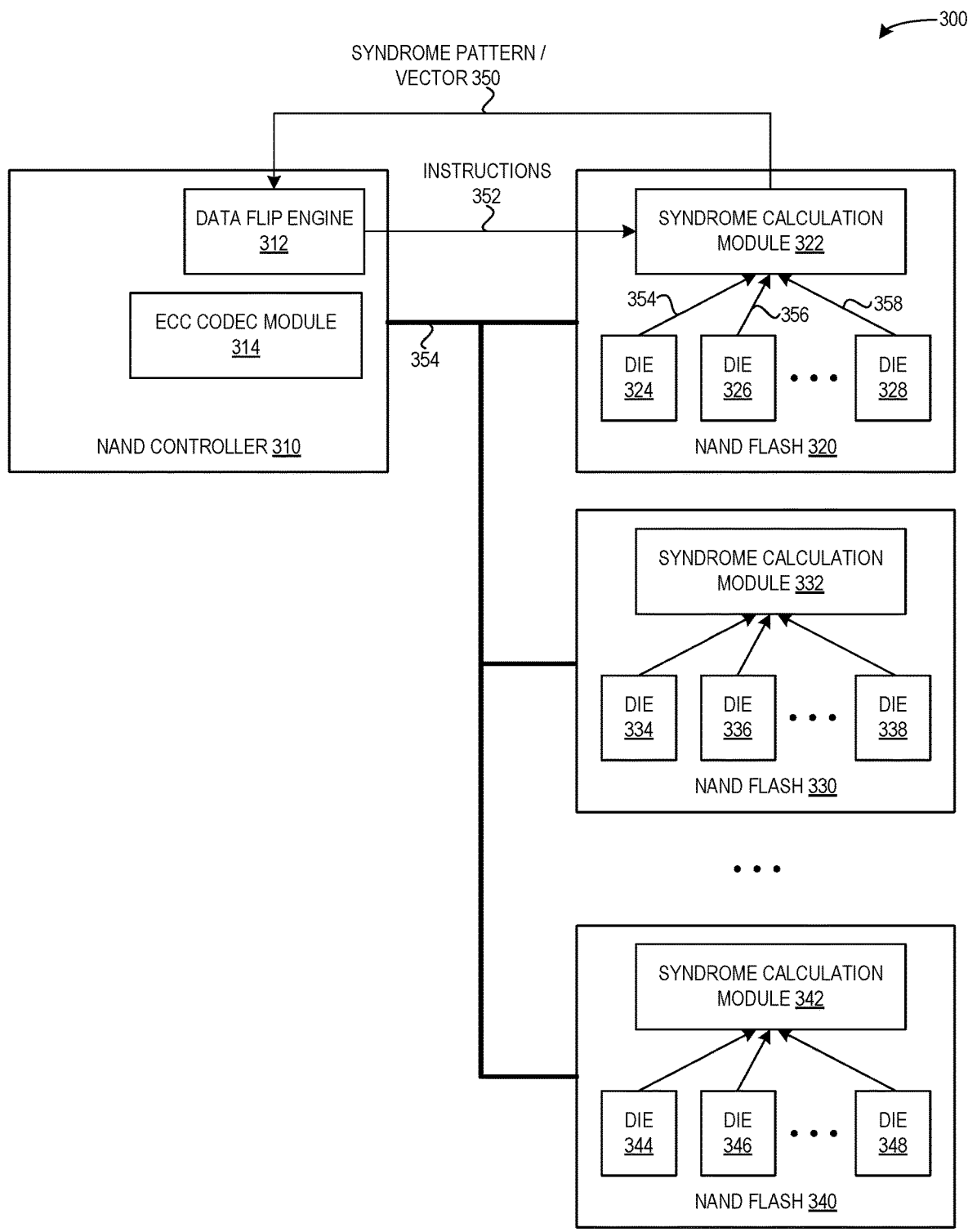
FIG. 3 illustrates an exemplary environment with a reduced involvement by the ECC module of a controller, including a retry process between a syndrome calculation module of a NAND unit and a data flip engine of the controller, in accordance with an embodiment of the present application.

Exemplary Environment with Retry Process Between Syndrome Calculation Module of a NAND Unit and Data Flip Engine of Controller FIG. 3 illustrates an exemplary environment 300 with a reduced involvement by an ECC module 314 of a controller 310, including a retry process between a syndrome calculation module 322 of a NAND unit 320 and a data flip engine 312 of controller 310, in accordance with an embodiment of the present application. Environment 300 can depict components of a storage drive, such as a NAND flash-based SSD. The storage drive can include: a NAND controller 310; and a plurality of NAND flash units 320, 330, and 340. NAND controller 310 can include a data flip engine 312 and an ECC codec module 314. Each NAND flash unit can include: a syndrome calculation module and a plurality of NAND die. For example: NAND flash unit 320 can include a syndrome calculation module 322 and a plurality of NAND dies 324, 326, and 328; NAND flash unit 330 can include a syndrome calculation module 332 and a plurality of NAND dies 334, 336, and 338; and NAND flash unit 340 can include a syndrome calculation module 342 and a plurality of NAND dies 344, 346, and 348.

The syndrome calculation module can be implemented in the NAND flash (i.e., a non-volatile memory unit), as an on-chip circuit or as a standalone chip which is packaged together with multiple NAND dies. The syndrome calculation module can be shared by multiple NAND dies. The controller can receive a request to read data stored in a NAND die of the NAND flash. The syndrome calculation module can directly accumulate the raw data which is read from the NAND die together with the corresponding parity check matrix. The syndrome calculation module can receive (or calculate) a non-zero syndrome which fails the parity check. In comparison with the length of the raw read data, the length of the syndrome can be generally around one magnitude shorter. If the syndrome is less than a predetermined threshold, the system can write the read data directly to a destination page assigned by the FTL, as described above in relation to FIGS. 2A and 2B.

If the syndrome is greater than the predetermined threshold, the system can determine whether a current number of retries is less than a predetermined number. The system can track the current number of retries as described herein.

If the current number of retries is less than the predetermined number, the system can execute a "retry process" between the calculation module and the data flip engine. The system can send the syndrome (or syndrome weight) as a pattern or vector to the data flip engine, which analyzes the syndrome. Based on the syndrome weight and the non-zero positions in the syndrome vector, and further based on the parity check matrix, the data flip engine can generate instructions about the locations of the bits to be flipped in the raw read data. The syndrome calculation module can flip the bits based on the instructions from the data flip engine, which can result in a reduction of errors in the raw read vector. This communication between the syndrome calculation module and the data flip engine can be referred to as a "retry process." The system can continue to execute a retry process for a predetermined number of times by tracking a current number of retries. The system can increment the current number of retries each time it performs another retry process. The system can continue to iterate through the retry process as long as the current number of retries is less than the predetermined number. When the current number of the retries is greater than the predetermined number, the system can send the raw data to the ECC codec module of the controller for further processing. This allows the read data to be directly written to the destination page with a tolerable level of errors, thus bypassing the ECC codec module in the controller.

For example, NAND controller 310 can receive a request to read data from NAND die 326 of NAND flash 320. NAND controller 310 can send a message to NAND flash 320 of the data requested to be read (via a communication 354). Syndrome calculation module 322 of NAND flash 320 can accumulate raw read data from die 326 of NAND flash 320 (via a communication 356), and calculate a non-zero syndrome which fails the parity check. If the syndrome is less than a predetermined threshold, the system writes the data directly to a destination page. If the syndrome is greater than the predetermined threshold, the system determines whether a current number of retries is less than a predetermined number.

If the current number of retries is less than the predetermined number, syndrome calculation module 322 can send a syndrome pattern/vector 350 to data flip engine 312 of NAND controller 310. Data flip engine 312 can generate instructions about the locations of the bits to be flipped in the raw read data, and send instructions 352 to syndrome calculation module 322, which can flip the bits of the raw read data based on instructions 352. This can result in reducing the number of errors in the raw read vector. The system can increment the current number of retries, and, while the syndrome is greater than the predetermined threshold, the system can iterate through this retry process while the current number of retries is less than the predetermined number.

If the current number of the retries is greater than the predetermined number, syndrome calculation module 322 can send the data to ECC codec module 314 of NAND controller 310 for further processing (e.g., via communication 354). ECC codec module 314 can obtain the data and decode the obtained data based on an error correction code. ECC codec module 314 can store the ECC-decoded data (i.e., the error-free data) in a buffer of the controller (not shown in FIG. 3; as indicated by data buffer 226 of FIG. 2A).

NAND controller 310 can acknowledge a completion of the read request, and can subsequently receive a request to write the data to a destination page of a NAND flash. The controller can write the data to the destination page of the corresponding NAND flash.

In some embodiments, when determining that the syndrome is less than the predetermined threshold, if the destination page is not in the same first non-volatile memory unit as the "origination page," the system can send the data back to NAND controller 310 to be written to a second non-volatile memory unit (via communication 354).

In other embodiments, when determining that the syndrome is less than the predetermined threshold, if the destination page is in the same first non-volatile memory unit as the "origination page," the system does not need to transmit the data back to the controller, and can instead write the data directly to the destination page in the same non-volatile memory unit (e.g., NAND flash) as the origination page. By bypassing movement to and storage in a data buffer of NAND controller 310 as well as a subsequent movement to the destination page, this reduced data movement can result in further efficiencies for the overall storage system.

Thus, environment 300 depicts how the syndrome calculation module and the data flip engine can communicate to iterate through a retry process, based on a comparison of the calculated syndrome weight with a predetermined threshold and a comparison of a current number of retries with a predetermined number. The communications can also allow the data to bypass the ECC codec module in the controller. The system can allow for the existence of a small or tolerable number of errors during data copy operations. By using the iterative data flipping on the read vector, the embodiments described herein can control the syndrome weight below a predetermined threshold which can reflect the erroneous level of the read result. An exemplary method corresponding to these communications is described below in relation to FIGS. 5A-5C.

Exemplary Circuitry of a Syndrome Calculation Module

Figure 4:
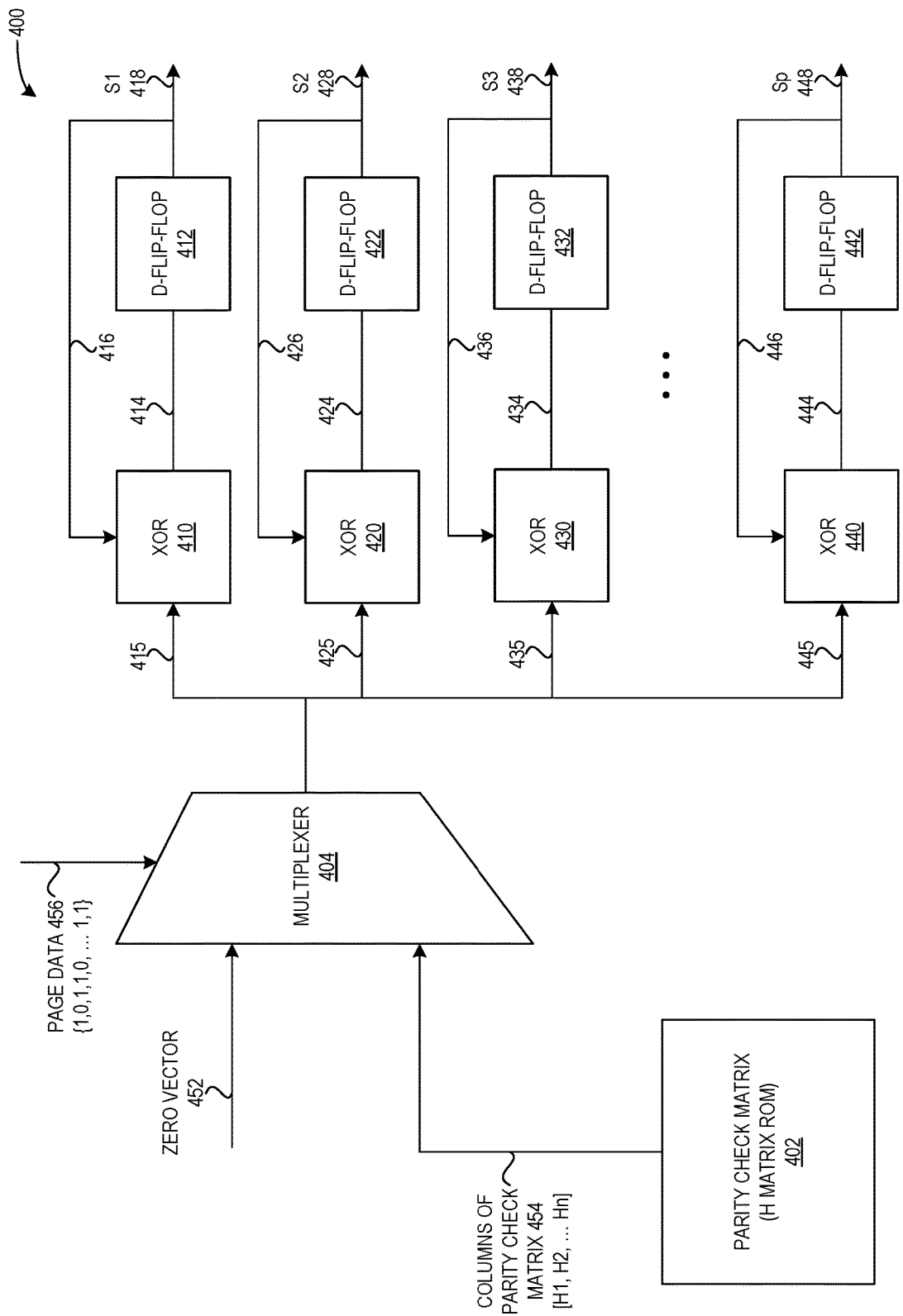
FIG. 4 illustrates an exemplary circuitry of a syndrome calculation module, in accordance with an embodiment of the present application.

FIG. 4 illustrates an exemplary circuitry of a syndrome calculation module 400, in accordance with an embodiment of the present application. Module 400 can include a parity check matrix 402, which can also be described as an "H Matrix" which is stored in a read-only memory (ROM). Parity check matrix 402 can include a plurality of columns, e.g., [H1, H2, . . . , Hn]. Raw read page data 456 can include a plurality of bits of a first page of data, e.g., [b1, b2, . . . , bn]. A multiplexer 404 can take as input each respective column of parity check matrix 402 (e.g., as columns 454) and each bit of the first page of data (e.g., as page data 456). Multiplexer 404 can select a respective column of parity check matrixes 454 if a respective bit of page data 456 has a value of 1, and can also select a zero vector 452 if a respective bit has a value of 0.

The system can determine a pattern corresponding to the syndrome weight by accumulating the data selected by multiplexer 404, e.g., by sending the selected data through a series of parallel exclusive-OR and D-Flip-Flop pairs. At the beginning of each retry process, the parallel D-Flip-Flop pairs are reset to zero. For example, an XOR module 410 can perform an XOR with an incoming bit (e.g., 415) based on a previously calculated syndrome value (e.g., 416), and send the result of the XOR to D-Flip-Flop 412 (e.g., in a data flip engine of a controller), via a communication 418. D-flip-flop 412 can obtain the syndrome pattern or vector portion S1. Thus, the system can obtain the syndrome patterns S2 to Sp in a similar manner.

The system can sweep from the first bit of page data 456 and the first column of parity check matrix 454 to the last bit of page data 456 and the last column of parity check matrix 454. The accumulated and calculated syndrome weight S can be represented as: $S=b1*H1+b2*H2+ \ldots +Bn*Hn=[S1, S2, \ldots, Sp]$. The system can indicate the erroneous level of the raw read data (e.g., n-bit length) with the syndrome S (e.g., p-bit length).

Method for Facilitating Operation of a Storage System

Figure 5A:
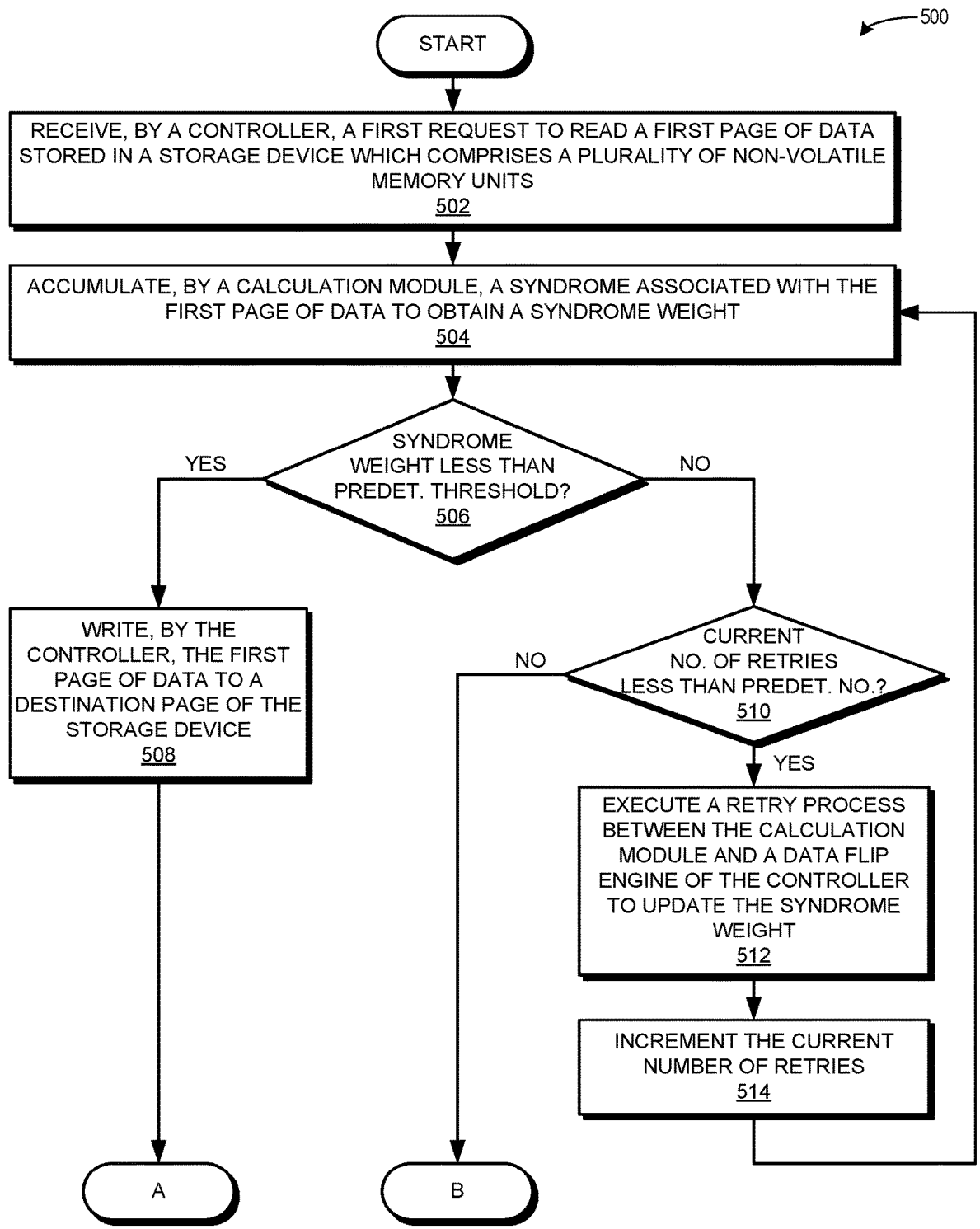
FIG. 5A presents a flowchart illustrating a method for facilitating operation of a storage system, in accordance with an embodiment of the present application.

FIG. 5A presents a flowchart illustrating a method for facilitating operation of a storage system, in accordance with an embodiment of the present application. During operation, the system receives, by a controller, a first request to read a first page of data stored in a storage device which comprises a plurality of non-volatile memory units (operation 502). The system accumulates, by a calculation module, a syndrome associated with the first page of data to obtain a syndrome weight (operation 504). In response to determining that the syndrome weight is less than a predetermined threshold (decision 506), the system writes, by the controller, the first page of data to a destination page of the storage device (operation 508), and the operation continues as described at Label A of FIG. 5B.

In response to determining that the syndrome weight is not less than (e.g., is greater than) a predetermined threshold (decision 506), the system determines a current number of retries. In response to determining that a current number of retries is not less than (e.g., is greater than) a predetermined number (decision 510), the operation continues as described at Label B of FIG. 5C. In response to determining that the current number of retries is less than (e.g., is not greater than) the predetermined number (decision 510), the system executes a retry process between the calculation module and a data flip engine of the controller to update the syndrome weight (operation 512), and the system increments the current number of retries (operation 514). The operation continues by returning to operation 504 (accumulating the syndrome).

Figure 5B:
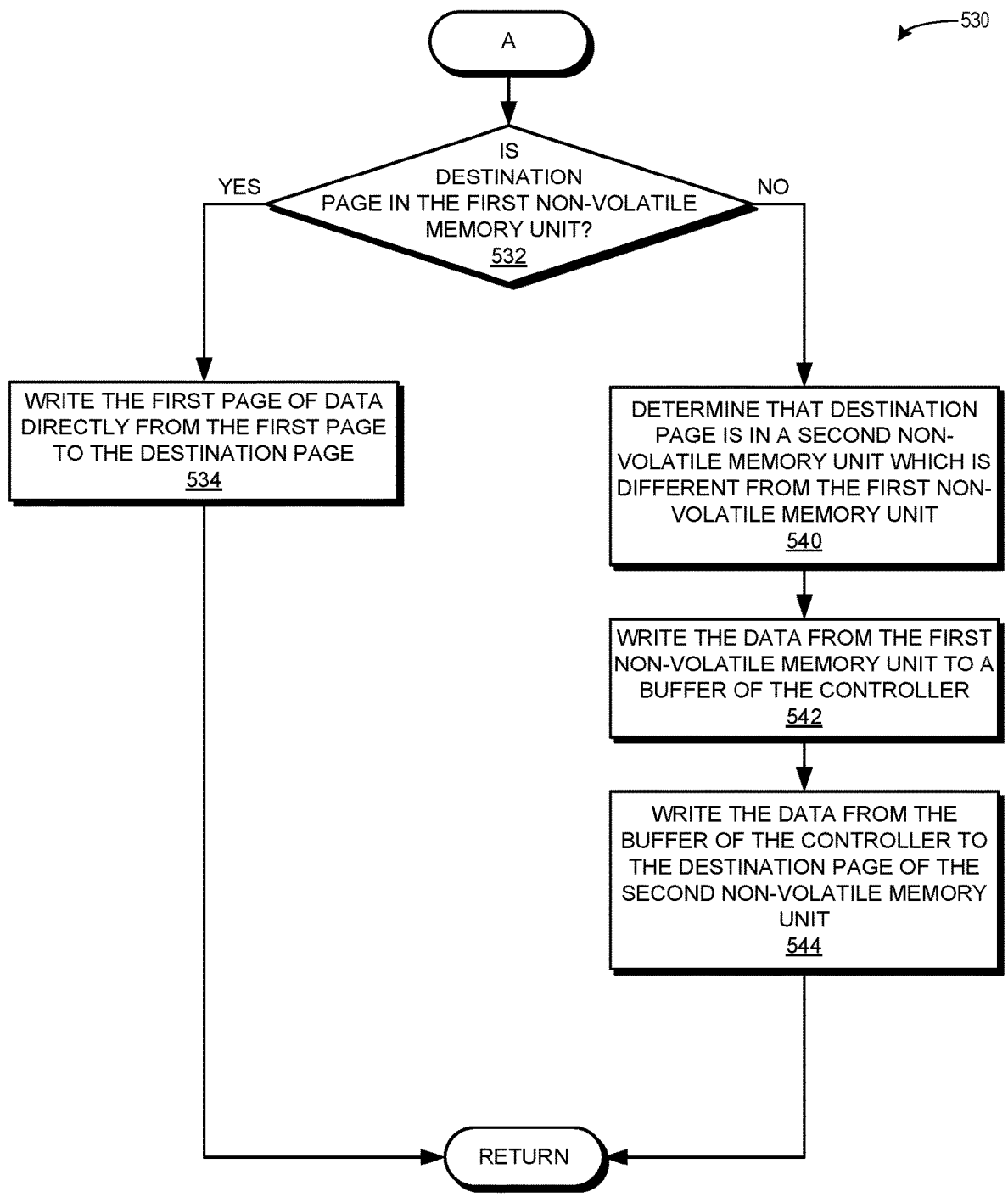
FIG. 5B presents a flowchart illustrating a method for facilitating operation of a storage system, in accordance with an embodiment of the present application.

FIG. 5B presents a flowchart 530 illustrating a method for facilitating operation of a storage system, in accordance with an embodiment of the present application. In response to determining that the destination page is in the first non-volatile memory unit (decision 532), the system writes the first page of data directly from the first page to the destination page (operation 534). In response to determining that the destination page is not in the first non-volatile memory unit (decision 532), the system determines that the destination page is in a second non-volatile memory unit which is different from the first non-volatile memory unit (operation 540). The system writes the data from the first non-volatile memory unit to a buffer of the controller (operation 542). The system writes the data from the buffer of the controller to the destination page of the second non-volatile memory unit (operation 544).

Figure 5C:
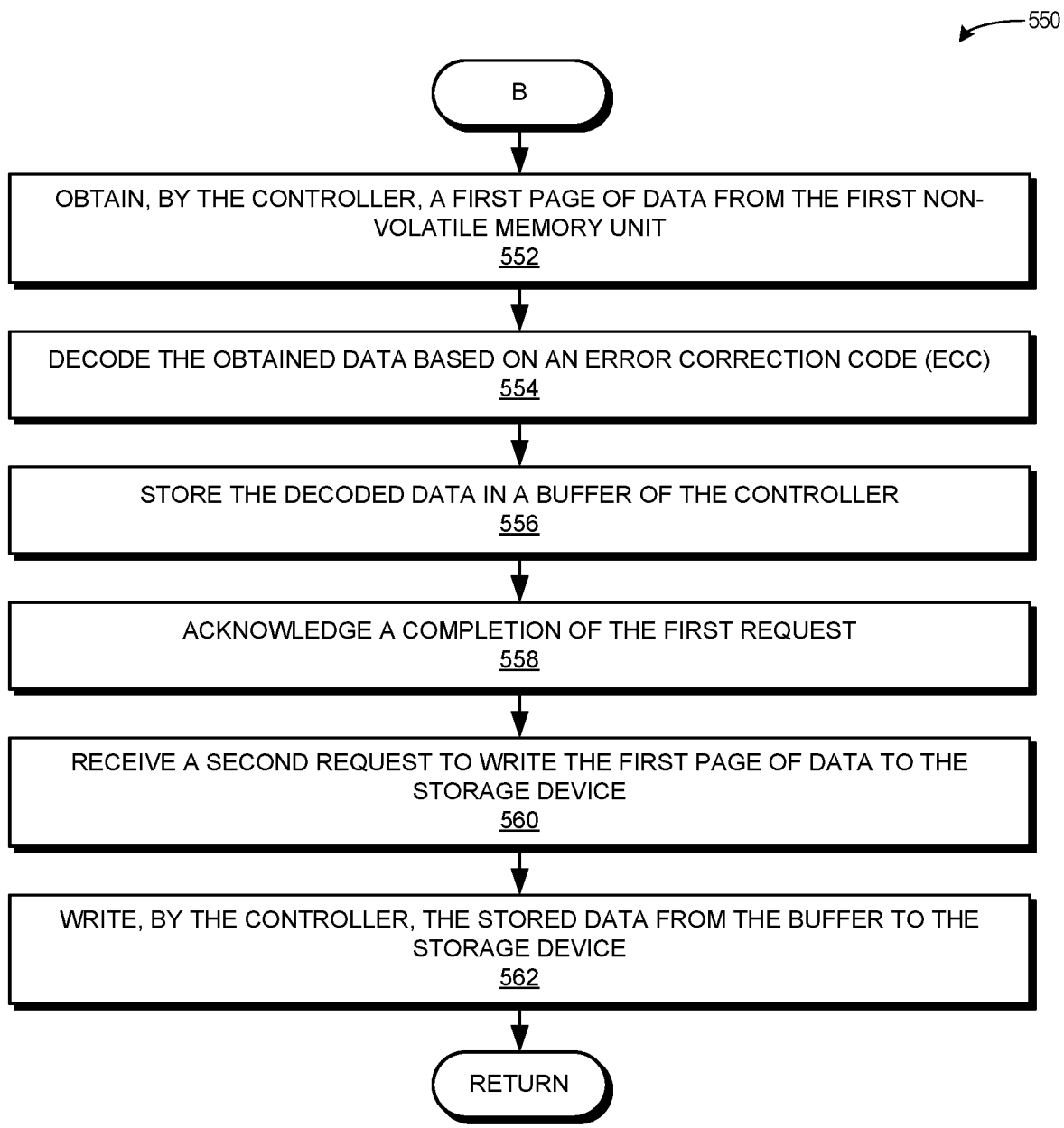
FIG. 5C presents a flowchart illustrating a method for facilitating operation of a storage system, in accordance with an embodiment of the present application.

FIG. 5C presents a flowchart 550 illustrating a method for facilitating operation of a storage system, in accordance with an embodiment of the present application. The system obtains, by the controller, the first page of data from the first non-volatile memory unit (operation 552). The system decodes the obtained data based on an error correction code (operation 554). The system stores the decoded data in a buffer of the controller (operation 556). The system acknowledges a completion of the first request (operation 558). The system receives a second request to write the first page of data to the storage device (operation 560). The system writes, by the controller, the stored data from the buffer to the storage device (operation 562), and the operation returns.

Figure 5D:
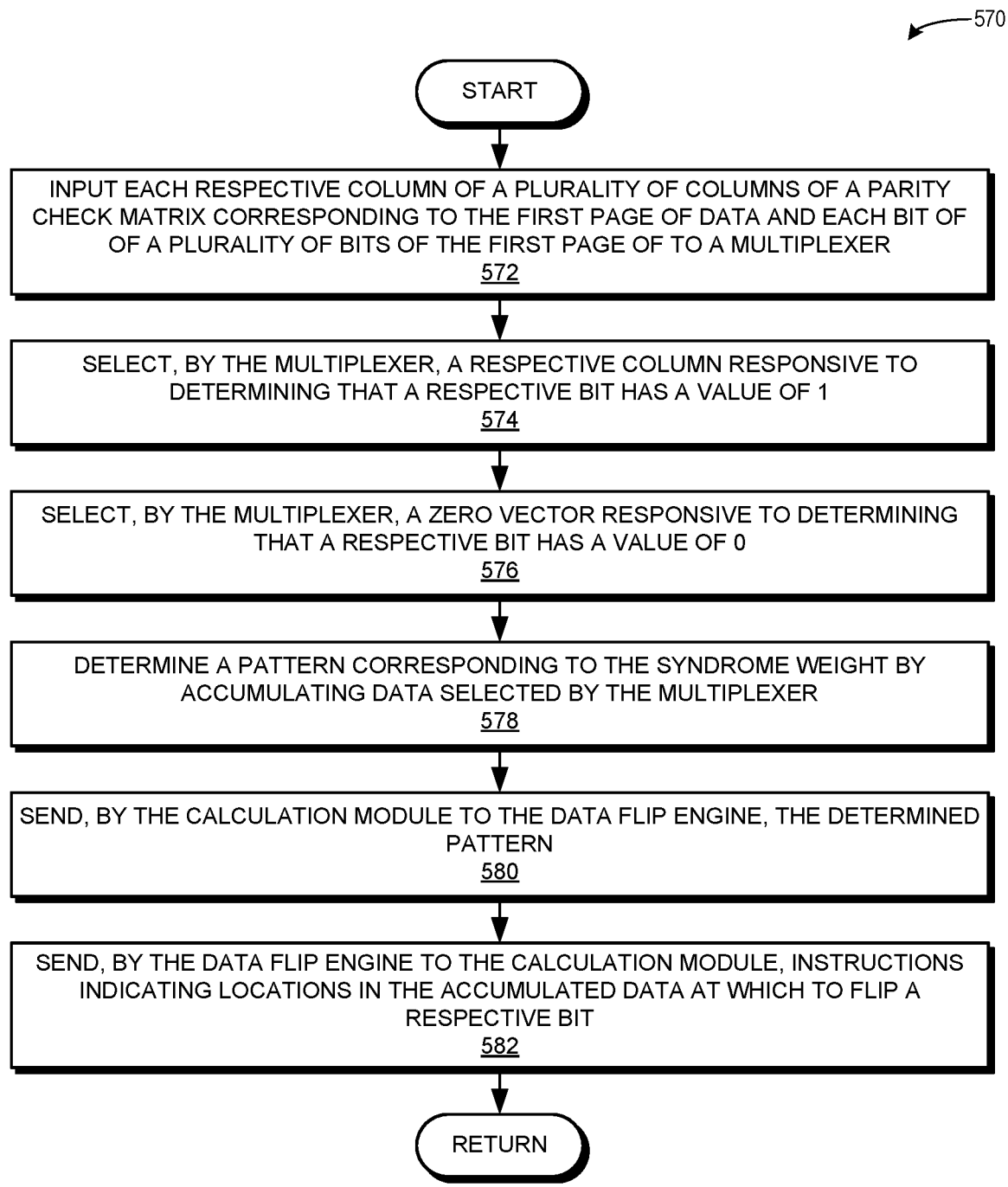
FIG. 5D presents a flowchart illustrating a method for facilitating operation of a storage system, in accordance with an embodiment of the present application.

FIG. 5D presents a flowchart 570 illustrating a method for facilitating operation of a storage system, in accordance with an embodiment of the present application. Flowchart 570 can describe executing the retry process between the calculation module and the data flip engine, as in operation 512 of FIG. 5A. During operation, the system inputs each respective column of a plurality of columns of a parity check matrix corresponding to the first page of data and each bit of a plurality of bits of the first page of data to a multiplexer (operation 572). The system selects, by the multiplexer, a respective column responsive to determining that a respective bit has a value of 1 (operation 574). The system selects, by the multiplexer, a zero vector responsive to determining that the respective bit has a value of 0 (operation 576). The system determines a pattern corresponding to the syndrome weight by accumulating data selected by the multiplexer (operation 578). Determining the pattern is based on a series of parallel exclusive-OR and D-Flip-Flop pairs, and wherein the parallel D-Flip-Flop pairs are reset to zero at the beginning of each retry process.

The system sends, by the calculation module to the data flip engine, the determined pattern (operation 580). After generating instructions indicating locations in the determined pattern at which to flip a respective bit (not shown), the system sends, by the data flip engine to the calculation module, the instructions indicating locations in the determined pattern at which to flip a respective bit (operation 582), and the operations returns. The system can also increate the current number of retries (as in operation 514, and the operation can thus return to operation 504 as indicated by operations 512 and 514 returning to operation 504.

Exemplary Computer System and Apparatus

Figure 6:
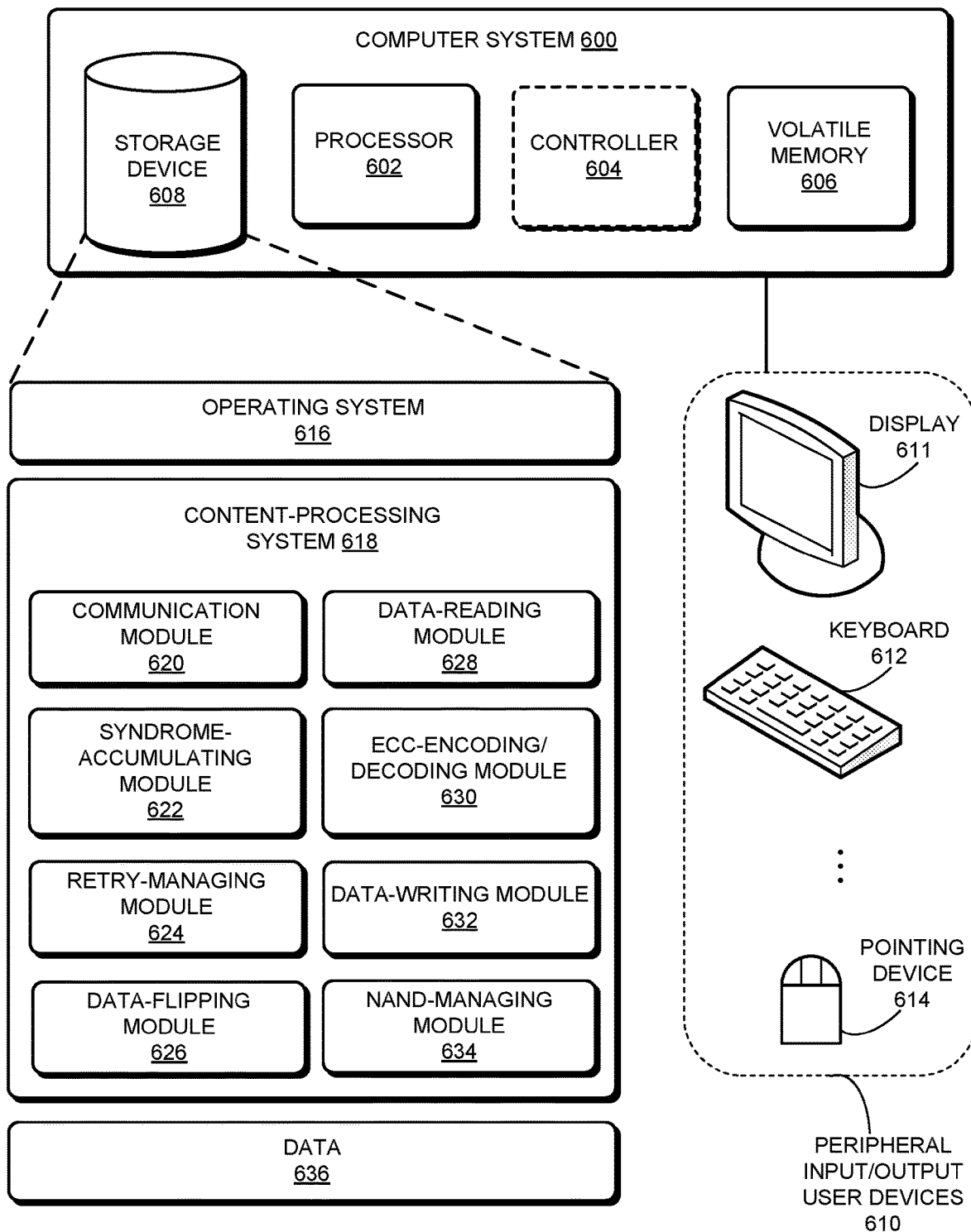
FIG. 6 illustrates an exemplary computer system that facilitates operation of a storage system, in accordance with an embodiment of the present application.

FIG. 6 illustrates an exemplary computer system 600 that facilitates operation of a storage system, in accordance with an embodiment of the present application. Computer system 600 includes a processor 602, a volatile memory 606, and a storage device 608. In some embodiments, computer system 600 can include a controller 604 (indicated by the dashed lines). Volatile memory 606 can include, e.g., random access memory (RAM), that serves as a managed memory, and can be used to store one or more memory pools. Storage device 608 can include persistent storage which can be managed or accessed via processor 602 (or controller 604). Furthermore, computer system 600 can be coupled to peripheral input/output (I/O) user devices 610, e.g., a display device 611, a keyboard 612, and a pointing device 614. Storage device 608 can store an operating system 616, a content-processing system 618, and data 636.

Content-processing system 618 can include instructions, which when executed by computer system 600, can cause computer system 600 or processor 602 to perform methods and/or processes described in this disclosure. Specifically, content-processing system 618 can include instructions for receiving and transmitting data packets, including data to be read or written and an input/output (I/O) request (e.g., a read request or a write request) (communication module 620).

Content-processing system 618 can further include instructions for receiving, by a controller, a first request to read a first page of data stored in a storage device which comprises a plurality of non-volatile memory units (communication module 620). Content-processing system 618 can include instructions for accumulating, by a calculation module, a syndrome associated with the first page of data to obtain a syndrome weight (syndrome-accumulating module 622). Syndrome-accumulating module 622 can perform operations as described above for syndrome-calculating module 322 of NAND flash 320 of FIG. 3. Content-processing system 618 can include instructions for, in response to determining that the syndrome weight is less than a predetermined threshold (syndrome-accumulating module 622), writing, by the controller, the first page of data to a destination page of the storage device (data-writing module 632). Content-processing system 618 can also include instructions for, in response to determining that the syndrome weight is greater than the predetermined threshold (syndrome-accumulating module 622) and that a current number of retries is less than a predetermined number (retry-managing module 624): executing a retry process between the calculation module and a data flip engine of the controller to update the syndrome weight (retry-managing module 624); and incrementing the current number of retries (retry-managing module 624).

Content-processing system 618 can additionally include instructions for, in response to determining that the syndrome weight is greater than the predetermined threshold (syndrome-accumulating module 622) and that the current number of retries is greater than the predetermined number (retry-managing module 624): obtaining, by the controller, the first page of data from the first non-volatile memory unit (data-reading module 628); decoding the obtained data based on an error correction code (ECC-encoding/decoding module 630); storing the decoded data in a buffer of the controller (data-writing module 630); in response to acknowledging a completion of the first request (communication module 620), receiving a second request to write the first page of data to the storage device (communication module 620); and writing, by the controller, the stored data from the buffer to the storage device (NAND-managing module 634 and data-writing module 632).

Content-processing system 618 can further include instructions for operations related to executing the retry process between the calculation module and the data flip engine of the controller to update the syndrome weight, including operations related to inputting columns and bits to a multiplexer, selecting an input based on a comparison, and determining a pattern corresponding to the syndrome weight by accumulating data selected by the multiplexer (syndrome-accumulating module 622, retry-managing module 624, and data-flipping module 626), as described above in relation to FIGS. 3 and 4.

Data 636 can include any data that is required as input or generated as output by the methods and/or processes described in this disclosure. Specifically, data 636 can store at least: data; a request; a read request; a write request; an input/output (I/O) request; data or metadata associated with a read request, a write request, or an I/O request; encoded or decoded data; ECC-encoded or ECC-decoded data; an indicator or identifier of a non-volatile memory unit; a syndrome; a syndrome weight, pattern, or vector; a predetermined threshold; an indicator of a first page of data; an indicator of a destination page; a current number of retries; a predetermined number; an error correction code; an acknowledgment; an indicator of a data buffer; a logical block address; a physical block address or other physical location; an indicator of a flash translation layer; a mapping table; a parity check matrix; a column; a bit; a plurality of bits; an indicator of a multiplexer, an XOR, or a data flip flop component; a zero vector; a determined pattern; and instructions indicating locations in data at which to flip a respective bit.

Figure 7:
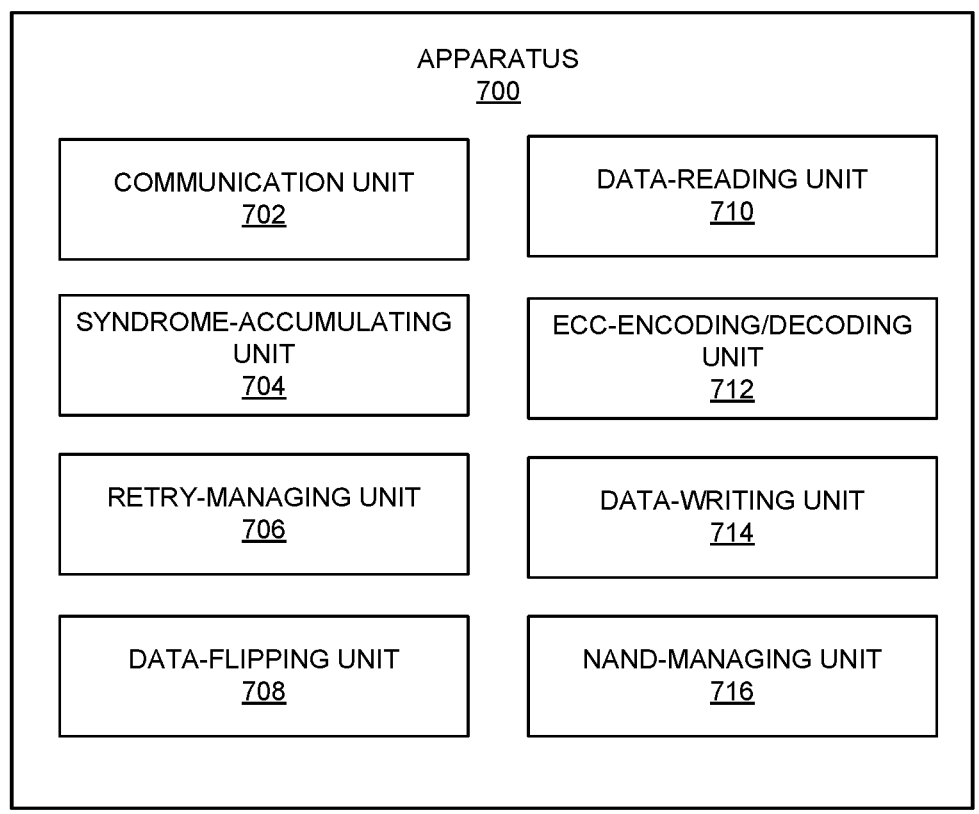
FIG. 7 illustrates an exemplary apparatus that facilitates operation of a storage system, in accordance with an embodiment of the present application.

FIG. 7 illustrates an exemplary apparatus 700 that facilitates operation of a storage system, in accordance with an embodiment of the present application. Apparatus 700 can comprise a plurality of units or apparatuses which may communicate with one another via a wired, wireless, quantum light, or electrical communication channel. Apparatus 700 may be realized using one or more integrated circuits, and may include fewer or more units or apparatuses than those shown in FIG. 7. Furthermore, apparatus 700 may be integrated in a computer system, or realized as a separate device or devices capable of communicating with other computer systems and/or devices.

Apparatus 700 can comprise modules or units 702-716 which are configured to perform functions or operations similar to modules 620-634 of computer system 600 of FIG. 6, including: a communication unit 702; a syndrome-accumulating unit 704; a retry-managing unit 706; a data-flipping unit 708; a data-reading unit 710; an ECC-encoding/decoding unit 712; a data-writing unit 714; and a NAND-managing unit 716.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
receiving, by a controller, a first request to read a first page of data stored in a first non-volatile memory unit in a storage device which comprises a plurality of non-volatile memory units;
accumulating, by a calculation module of the first non-volatile memory unit, a syndrome associated with the first page of data to obtain a syndrome weight; and
in response to determining that the syndrome weight is greater than a predetermined threshold and that a current number of retries is less than a predetermined number, wherein the current number of retries corresponds to a number of times that a retry process has been executed between the calculation module and a data flip engine of the controller:
executing the retry process between the calculation module and a data flip engine of the controller to update the syndrome weight wherein executing the retry process comprises accumulating, by the calculation module, the updated syndrome weight to obtain the syndrome weight; and
incrementing the current number of retries.

2. The method of claim 1, further comprising:
in response to determining that the syndrome weight is greater than the predetermined threshold and that the current number of retries is greater than the predetermined number:
obtaining, by the controller, the first page of data from the first non-volatile memory unit;
decoding the obtained data based on an error correction code;
storing the decoded data in a buffer of the controller;
in response to acknowledging a completion of the first request, receiving a second request to write the first page of data to the storage device; and
writing, by the controller, the stored data from the buffer to the storage device.

3. The method of claim 2,
wherein the obtained data is decoded by an error correction code module of the controller,
wherein the second request indicates a destination page of the non-volatile memory to which the first page of data is to be written, and
wherein the stored data is written by the controller from the buffer to the destination page of the non-volatile memory.

4. The method of claim 2,
wherein the first request and the second request are received from a flash translation layer (FTL) module of a host or the storage device,
wherein the first request and the second request are associated with a garbage collection operation, and
wherein acknowledging the completion of the first request involves generating an acknowledgment for a host.

5. The method of claim 1, wherein the calculation module resides in a first non-volatile memory unit in which the first page of data is stored, and wherein the method further comprises:
in response to determining that the syndrome weight is less than the predetermined threshold:
in response to determining that a destination page is in the first non-volatile memory unit, writing the first page of data directly from the first page to the destination page; and
in response to determining that the destination page is in a second non-volatile memory unit which is different from the first non-volatile memory unit:
writing the data from the first non-volatile memory unit to a buffer of the controller; and
writing the data from the buffer of the controller to the destination page of the second non-volatile memory unit.

6. The method of claim 5, wherein writing the first page of data to the destination page further comprises:
writing the first page of data with a corresponding logical block address to the destination page; and
updating a mapping table which maps the logical block address to physical address associated with the destination page.

7. The method of claim 1, wherein executing the retry process between the calculation module and the data flip engine of the controller to update the syndrome weight further comprises:
inputting each respective column of a plurality of columns of a parity check matrix corresponding to the first page of data and each bit of a plurality of bits of the first page of data to a multiplexer;
selecting, by the multiplexer, a respective column responsive to determining that a respective bit has a value of 1;
selecting, by the multiplexer, a zero vector responsive to determining that the respective bit has a value of 0; and
determining a pattern corresponding to the syndrome weight by accumulating data selected by the multiplexer,
wherein determining the pattern is based on a series of parallel exclusive-OR and D-Flip-Flop pairs, and
wherein the parallel D-Flip-Flop pairs are reset to zero at the beginning of each retry process.

8. The method of claim 7,
wherein the calculation module sends, to the data flip engine, the determined pattern, and
wherein the data flip engine sends, to the calculation module, instructions indicating locations in the accumulated data at which to flip a respective bit.

9. A computer system, comprising:
a processor; and
a memory coupled to the processor and storing instructions which, when executed by the processor, cause the processor to perform a method, the method comprising:
receiving, by a controller, a first request to read a first page of data stored in a first non-volatile memory unit in a storage device which comprises a plurality of non-volatile memory units;
accumulating, by a calculation module of the first non-volatile memory unit, a syndrome associated with the first page of data to obtain a syndrome weight; and
in response to determining that the syndrome weight is greater than a predetermined threshold and that a current number of retries is less than a predetermined number, wherein the current number of retries corresponds to a number of times that a retry process has been executed between the calculation module and a data flip engine of the controller:
executing the retry process between the calculation module and a data flip engine of the controller to update the syndrome weight, wherein executing the retry process comprises accumulating, by the calculation module, the updated syndrome weight to obtain the syndrome weight; and
incrementing the current number of retries.

10. The computer system of claim 9, wherein the method further comprises:
in response to determining that the syndrome weight is greater than the predetermined threshold and that the current number of retries is greater than the predetermined number:
obtaining, by the controller, the first page of data from the first non-volatile memory unit;
decoding the obtained data based on an error correction code;
storing the decoded data in a buffer of the controller;
in response to acknowledging a completion of the first request, receiving a second request to write the first page of data to the storage device; and
writing, by the controller, the stored data from the buffer to the storage device.

11. The computer system of claim 10,
wherein the obtained data is decoded by an error correction code module of the controller,
wherein the second request indicates a destination page of the non-volatile memory to which the first page of data is to be written, and
wherein the stored data is written by the controller from the buffer to the destination page of the non-volatile memory.

12. The computer system of claim 10,
wherein the first request and the second request are received from a flash translation layer (FTL) module of a host or the storage device,
wherein the first request and the second request are associated with a garbage collection operation, and
wherein acknowledging the completion of the first request involves generating an acknowledgment for a host.

13. The computer system of claim 9, wherein the calculation module resides in a first non-volatile memory unit in which the first page of data is stored, and wherein the method further comprises:
in response to determining that the syndrome weight is less than the predetermined threshold:
in response to determining that a destination page is in the first non-volatile memory unit, writing the first page of data directly from the first page to the destination page; and
in response to determining that the destination page is in a second non-volatile memory unit which is different from the first non-volatile memory unit:
writing the data from the first non-volatile memory unit to a buffer of the controller; and
writing the data from the buffer of the controller to the destination page of the second non-volatile memory unit.

14. The computer system of claim 13, wherein writing the first page of data to the destination page further comprises:
writing the first page of data with a corresponding logical block address to the destination page; and
updating a mapping table which maps the logical block address to physical address associated with the destination page.

15. The computer system of claim 9, wherein executing the retry process between the calculation module and the data flip engine of the controller to update the syndrome weight further comprises:
inputting each respective column of a plurality of columns of a parity check matrix corresponding to the first page of data and each bit of a plurality of bits of the first page of data to a multiplexer;
selecting, by the multiplexer, a respective column responsive to determining that a respective bit has a value of 1;
selecting, by the multiplexer, a zero vector responsive to determining that the respective bit has a value of 0; and
determining a pattern corresponding to the syndrome weight by accumulating data selected by the multiplexer,
wherein determining the pattern is based on a series of parallel exclusive-OR and D-Flip-Flop pairs, and wherein the parallel D-Flip-Flop pairs are reset to zero at the beginning of each retry process.

16. The computer system of claim 15,
wherein the calculation module sends, to the data flip engine, the determined pattern, and
wherein the data flip engine sends, to the calculation module, instructions indicating locations in the accumulated data at which to flip a respective bit.

17. An apparatus, comprising:
a communication unit configured to receive, by a controller, a first request to read a first page of data stored in a first non-volatile memory unit in a storage device which comprises a plurality of non-volatile memory units;
a syndrome-accumulating unit configured to accumulate a syndrome associated with the first page of data to obtain a syndrome weight; and
a retry-managing unit configured to, in response to the syndrome-accumulating unit determining that the syndrome weight is greater than a predetermined threshold and in response to the retry-managing unit determining that a current number of retries is less than a predetermined number, wherein the current number of retries corresponds to a number of times that a retry process has been executed between the calculation module and a data flip engine of the controller:
execute the retry process between the calculation module and a data flip engine of the controller to update the syndrome weight, wherein executing the retry process comprises accumulating, by the syndrome-accumulating unit, the updated syndrome weight to obtain the syndrome weight; and increment the current number of retries.

18. The apparatus of claim 17, further comprising:

an ECC-encoding/decoding unit; and a data-reading unit configured to, in response to the syndrome-accumulating unit determining that the syndrome weight is greater than the predetermined threshold and in response to the retry-managing unit determining that the current number of retries is greater than the predetermined number:

obtain the first page of data from the first non-volatile memory unit;

wherein the ECC-encoding/decoding unit is configured to decode the obtained data based on an error correction code;

wherein the data-writing unit is further configured to store the decoded data in a buffer of the controller;

wherein in response to acknowledging a completion of the first request, the communication module is further configured to receive a second request to write the first page of data to the storage device; and wherein the data-writing unit is further configured to write the stored data from the buffer to the storage device.

19. The apparatus of claim 17, wherein the syndrome-accumulating unit resides in a first non-volatile memory unit in which the first page of data is stored, and wherein in response to the syndrome-accumulating unit determining that the syndrome weight is less than the predetermined threshold, the apparatus further comprises:

a data-writing unit; and a NAND-managing unit configured to determine whether a destination page is in the first non-volatile memory;

wherein the data-writing unit is configured to, in response to the NAND-managing unit determining that the destination page is in the first non-volatile memory unit, write the first page of data directly from the first page to the destination page; and wherein the data-writing unit is further configured to, in response to the NAND-managing unit determining that the destination page is in a second non-volatile memory unit which is different from the first non-volatile memory unit:

write the data from the first non-volatile memory unit to a buffer of the controller; and write the data from the buffer of the controller to the destination page of the second non-volatile memory unit.

20. The apparatus of claim 17, further comprising:

a data-flipping unit, wherein the syndrome-accumulating module is further configured to send, to the data-flipping unit, the determined pattern, and wherein the data-flipping module is configured to send, to the syndrome-accumulating unit, instructions indicating locations in accumulated data at which to flip a respective bit.

* * * * *